US011217554B2

(12) United States Patent
Wrosch et al.

(10) Patent No.: US 11,217,554 B2
(45) Date of Patent: Jan. 4, 2022

(54) METALLIC ADHESIVE COMPOSITIONS HAVING GOOD WORK LIVES AND THERMAL CONDUCTIVITY, METHODS OF MAKING SAME AND USES THEREOF

(71) Applicant: ORMET CIRCUITS, INC., San Diego, CA (US)

(72) Inventors: Matthew Wrosch, Escondido, CA (US); Catherine A. Shearer, San Marcos, CA (US)

(73) Assignee: Ormet Circuits, Inc., San Diego, CA (US)

( * ) Notice: Subject to any disclaimer, the term of this patent is extended or adjusted under 35 U.S.C. 154(b) by 0 days.

(21) Appl. No.: 16/500,607

(22) PCT Filed: Jun. 7, 2018

(86) PCT No.: PCT/US2018/036385
§ 371 (c)(1),
(2) Date: Oct. 3, 2019

(87) PCT Pub. No.: WO2018/231612
PCT Pub. Date: Dec. 20, 2018

(65) Prior Publication Data
US 2021/0118836 A1 Apr. 22, 2021

Related U.S. Application Data

(60) Provisional application No. 62/518,268, filed on Jun. 12, 2017, provisional application No. 62/530,974, filed on Jul. 11, 2017.

(51) Int. Cl.
*H01L 23/373* (2006.01)
*H01L 23/00* (2006.01)

(52) U.S. Cl.
CPC .......... *H01L 24/32* (2013.01); *H01L 23/3735* (2013.01); *H01L 2224/8384* (2013.01); *H01L 2924/078* (2013.01); *H01L 2924/14* (2013.01)

(58) Field of Classification Search
CPC ................. H01L 24/32; H01L 23/3735; H01L 2224/8384; H01L 2924/14; H01L 2924/078
(Continued)

(56) References Cited

U.S. PATENT DOCUMENTS 5,476,748 A    12/1995  Steinmann
5,605,941 A *   2/1997  Steinmann ............ C07C 271/28
                                         522/170
(Continued)

FOREIGN PATENT DOCUMENTS

EP        3495090 A1    6/2019
WO    WO2013122800 A1    8/2013
(Continued)

OTHER PUBLICATIONS

Chatterjee, Amit, "Thermoset Resins," Wiley Encyclopedia of Composites, Published 2012 by John Wiley & Sons, Inc.
(Continued)

*Primary Examiner* — Vu A Vu
(74) *Attorney, Agent, or Firm* — Mitchell Brustein (57) ABSTRACT

Thermally conductive adhesive materials having a first metallic component with a high melting point metal; a second metallic component having a low melting point metal; a fatty acid, an optional amine, an optional triglyceride and optional additives. Also provided are methods of making the same and uses thereof for adhering electronic components to substrates.

27 Claims, 1 Drawing Sheet

(58) Field of Classification Search
USPC .......................................................... 257/676
See application file for complete search history.

(56) References Cited

U.S. PATENT DOCUMENTS

| | | | |
|---|---|---|---|
| 5,716,663 A | 2/1998 | Capote | |
| 5,830,389 A | 11/1998 | Capote | |
| 5,853,622 A | 12/1998 | Gallagher | |
| 5,922,397 A | 7/1999 | Brandt | |
| 5,948,533 A | 9/1999 | Gallagher | |
| 5,980,785 A | 11/1999 | Xi | |
| 6,716,036 B2 | 4/2004 | Gandhi | |
| 6,831,136 B2 | 12/2004 | Chao | |
| 6,855,776 B2 | 2/2005 | Chao | |
| 7,858,074 B2 | 12/2010 | Caron | |
| 7,888,411 B2 | 2/2011 | Wrosch | |
| 8,840,700 B2 | 9/2014 | Shearer | |
| 9,583,453 B2 | 2/2017 | Shearer | |
| 2005/0256262 A1 | 11/2005 | Hill | |
| 2008/0089836 A1* | 4/2008 | Hainfeld | A61K 49/0428 424/1.11 |
| 2008/0128922 A1* | 6/2008 | Kotani | C08G 59/621 257/793 |
| 2014/0042212 A1* | 2/2014 | Shearer | B23K 35/02 228/248.1 |
| 2014/0131898 A1* | 5/2014 | Shearer | H01L 24/27 257/783 |
| 2016/0059361 A1* | 3/2016 | Schafer | B23K 35/025 361/760 |

FOREIGN PATENT DOCUMENTS

WO  WO2014082100 A1  5/2014
WO  WO2016174584 A1  11/2016

OTHER PUBLICATIONS

Thomas, Raju, et al., "Micro- and Nanostructured Epoxy/Rubber Blends," Published 2014 by Wiley-VCH Verlag GmbH & Co. KGaA.
International Search Report, PCT/US2018/036385, dated Feb. 22, 2019, corresponds to U.S. Appl. No. 16/500,607.
International Written Opinion, PCT/US2018/036385, dated Feb. 22, 2019, corresponds to U.S. Appl. No. 16/500,607.
EP Office action dated Aug. 26, 2021.

* cited by examiner

METALLIC ADHESIVE COMPOSITIONS HAVING GOOD WORK LIVES AND THERMAL CONDUCTIVITY, METHODS OF MAKING SAME AND USES THEREOF

This application is a United States National Stage Patent Application under 35 U.S.C. § 371 of International Patent Application No. PCT/US2018/036385, filed 7 Jun. 2018, which claims priority to U.S. Provisional Patent Application No. 62/518,268, filed 12 Jun. 2017, and U.S. Provisional Patent Application No. 62/530,974, filed 11 Jul. 2017, the contents of each of which are being hereby incorporated herein by reference.

FIELD OF THE INVENTION

The present invention relates to metal compositions, methods of preparation thereof and uses thereof. More specifically, the present invention relates to metallic transient liquid phase sintering compositions containing blended formulations of metals and metal alloys that are useful for providing electrical and/or thermal connections to or between integrated circuit components and/or semiconductor packaging by forming interconnected conductive metallurgical networks with increased stability, resistance to thermal stress, ability to mitigate coefficient of thermal expansion (CTE) mismatch between materials, increased work life, void-free bond lines and high effective thermal conductivity.

BACKGROUND OF THE INVENTION

The electronics industry has been driven towards higher performance and functionality in smaller form factors. At the production level, these driving forces have translated into smaller circuit features, designs and manufacturing methods that support more efficient circuit routing, elimination of layers of packaging, and sophisticated engineered materials. Issues that have been exacerbated by these trends include thermal management and management of the thermo-mechanical stresses generated by close juxtaposition of dissimilar materials.

Transient liquid phase sintering (TLPS) compositions have been used as replacements for conventional electrically and/or thermally conductive materials in a wide variety of applications including assembly of electronic components, in-plane circuit traces, interconnection of circuit traces on different planes, assembly of unpackaged integrated circuit die onto packaging elements, and the like. See, for example, U.S. Pat. Nos. 7,888,411; 6,716,036; 5,980,785; 5,948,533; 5,922,397; 5,853,622; 5,716,663 and 5,830,389, the contents of which are incorporated herein by reference in their entireties.

A variety of electronic device attach materials, including lead-free solders, nano-sintering pastes, conductive adhesives and existing TLPS pastes, are currently employed for attaching semiconductors to their substrates. But, solders do not remain thermally stable after reflow; nano-sintering pastes are not easily processed, typically requiring added pressure; and conductive adhesives do not form metallurgical interfaces, resulting in poor thermal transfer.

Solders have been commonly used to attach semiconductor die to substrates, which are then further processed to produce a fully-packaged semiconductor die component. Such components are then commonly attached to printed circuit boards, along with other electronics components, to form an electronic device. Most typically, solder is also used to make the secondary connection between the electronic components and the printed circuit board. In order to prevent the solder connection within the fully-packaged semiconductor die component from remelting during the subsequent assembly cycle, a solder with a higher melting point than the one used for connection to the printed circuit board must be selected for the attachment of the semiconductor die to the substrate. Solders with melting temperatures substantially in excess (>25° C.) of those lead-free solders commonly used to attach electronic components to circuit boards are limited to those with either high lead or high gold content. The exemption for use of lead, a toxin, in semiconductor die attachment is being truncated to an increasingly narrow range of applications. The use of gold solders adds substantial cost to the production of a fully-packaged semiconductor die component.

Further, currently available TLPS pastes typically incorporate a volatile solvent carrier as a flux-carrier and/or rheology modifier. Although useful for manipulating viscosity, such solvent-based formulations suffer from solvent bleed-out (i.e., the tendency for the material to flow away from its initial deposit) which limits their applicability in certain applications (e.g., tight-pitch applications). In addition, such formulations can result in high void-content, which happens as the solvent is removed during thermal processing. To overcome this, the current strategy has often involved the further incorporation of a liquid resin into the binder chemistry to fill in the voids after solvent removal. However, this results in resin rich areas which reduce the overall effectiveness of the thermal path.

In the known compositions, a diluent is typically used to produce a composition of a paste-type consistency that maintains liquidity over a customary period of use in a high-volume manufacturing environment. This diluent is conventionally a solvent, a non-solvating volatile liquid, a resin, or a combination thereof. In the case in which a solvent or non-solvating volatile liquid is used, the evolution of the solvent during thermal processing of the joining material has the potential to create void pockets within the bondline, which results in a reduction of effective conductive area and volume and a concomitant reduction in electrical and thermal conductivity performance. Conversely, if a non-volatile organic resin is used to provide the liquidity, such a resin must be rendered non-liquid after thermal processing of the joint and could occupy a significant volume fraction of the joint, also resulting in a reduction of effective conductive area and volume and a concomitant reduction in electrical and thermal conductivity performance.

In addition to the incorporation of a diluent, the known compositions conventionally incorporate organic additives to provide specific attributes that facilitate high-volume-manufacturing of electronic devices for a particular application. These attributes vary by the specific application, but may include characteristics such as flow, tack, rheology, suspension, evaporation rate, lubricity, surface tension, emulsification, de-aeration, and the like. The use of such chemical additives, while providing a specific utility, can also aggregates to effectively reduce the volume content of metal in the processed joint formed from the composition, and therefore, reduces the effective electrical and thermal conductivity of the joint relative to one composed substantially of metal.

Accordingly, there is a continued need for new electrically and/or thermally conductive materials and, more specifically, electrically and/or thermally conductive joining materials. In particular, it would be advantageous to provide electrically and/or thermally conductive materials that provide an inexpensive, robust, low process temperature, and reliable electrical and thermal interconnection strategy at various critical junctions within electronic device processing schemes. Further, it would be advantageous to provide electrically and/or thermally conductive materials with reduced levels of environmental hazards and toxins (e.g., lead, volatile organic compounds (VOCs), etc.). Yet further, it would be advantageous to provide electrically and/or thermally conductive materials that produce few or no voids when sintered. Still further, it would be advantageous to provide electrically and/or thermally conductive materials with long work or pot lives (e.g., at least about 5 hours, at least about 10 hours, at least about 20 hours, etc.). Even further, it would be advantageous to provide electrically and/or thermally conductive materials with low solvent contents. In particular, it would be advantageous to provide electrically and/or thermally conductive materials with long work or pot lives in combination with low solvent contents such that joints formed from such compositions are predominantly composed of metal after processing with little residual organic content to degrade performance. The present disclosure addresses these needs.

SUMMARY OF THE INVENTION

In one of its aspects, the present invention relates to a particle mixture comprising a first metallic component comprising a high melting point metal; a second metallic component comprising a low melting point metal; a fatty acid; an optional amine, an optional triglyceride, and optional additives, wherein the low melting point metal is capable of reacting with the high melting point metal to form an intermetallic species at temperature T1. In certain embodiments, the particle mixture composition is substantially free of diluents and organic additives. In other embodiments, the particle mixture consists essentially of a first metallic component; a second metallic component; a fatty acid; an optional amine; an optional triglyceride; optional additives; and minor impurities. Such compositions readily provide pastes with good workability, very low voiding, and exemplary thermal conductivity. Due to the thermally activated drying nature of the present compositions, the resulting bondline can have extremely high metal loading levels (e.g., >95%) and unexpectedly high thermal conductivity (e.g., more than 45 W/m–K).

In another of its aspects, the present invention relates to a method for preparing a particle mixture of the present invention. The method comprises the step of combining a predetermined ratio of a first metallic component, a second metallic component and a fatty acid to form a mixture thereof.

In still another of its aspects, the present invention relates to an electronic assembly formed using a particle mixture of the present invention. The electronic assembly comprises an electronic component and a substrate, wherein the particle mixture is disposed between a bonding surface of the electronic component and a bonding surface of the substrate.

In yet another of its aspects, the present invention relates to a process for adhering an electronic component to a substrate using a particle mixture of the present invention. The process comprises the steps of applying the particle mixture between a bondable surface of the electronic component and a bondable surface of the substrate; and heating one or more of the substrate, the particle mixture and the electronic component to sinter the particle mixture thereby adhering the electronic component to the substrate.

DEFINITIONS

Unless otherwise stated, the following terms used in the specification and claims shall have the following meanings for the purpose of this Application.

In this application, the use of the singular includes the plural, and the words "a", "an" and "the" mean "at least one", unless specifically stated otherwise. Furthermore, the use of the term "including", as well as other forms such as "includes" and "included", is not limiting. Also, terms such as "element" or "component" encompass both elements and components comprising one unit and elements or components that comprise more than one unit, unless specifically stated otherwise. As used herein, the conjunction "and" is intended to be inclusive and the conjunction "or" is not intended to be exclusive, unless otherwise indicated. For example, the phrase "or, alternatively" is intended to be exclusive. As used herein, the term "and/or" refers to any combination of the foregoing elements including using a single element.

The term "about" or "approximately," when used in connection with a measureable numerical variable, refers to the indicated value of the variable and to all values of the variable that are within the experimental error of the indicated value (e.g., within the 95% confidence limit for the mean) or within ±10 percent of the indicated value, whichever is greater.

Whenever it appears herein, a numerical range, such as "45-55", refers to each integer in the given range; e.g., "45-55%" means that the percentage can be 45%, 46%, etc., up to and including 55%. Where a range described herein includes decimal values, such as "1.2% to 10.5%", the range refers to each decimal value of the smallest increment indicated in the given range; e.g. "1.2% to 10.5%" means that the percentage can be 1.2%, 1.3%, 1.4%, 1.5%, etc. up to and including 10.5%; while "1.20% to 10.50%" means that the percentage can be 1.20%, 1.21%, 1.22%, 1.23%, etc. up to and including 10.50%.

As used herein, the term "substantially" refers to a great extent or degree. For example, "substantially all" typically refers to at least about 90%, frequently at least about 95%, often at least 99%, and more often at least about 99.9%.

The term "alloy" refers to a mixture containing two or more metals, and optionally additional non-metals, where the elements of the alloy are fused together or dissolved into each other when molten. The notation used herein for alloy compositions lists two or more elements using their IUPAC symbols separated by a forward slash ("/"). When given, the proportions of the elements in the alloy are indicated by subscripts corresponding to the weight percent of the element in the alloy. For example, Sn/Bi represents an alloy of tin (Sn) and bismuth (Bi), which can be any proportion of these two elements. Sn(60)/Bi(40) represents a specific alloy of tin and bismuth that contains 60 percent by weight of tin and 40 percent by weight of bismuth. Where a range is given for the weight percent of an element(s) in an alloy, the range indicates that the element can be present in any amount within the indicated range. For example, Sn(70-90)/Bi(10-30) refers to an alloy containing from 70 weight percent to 90 weight percent of tin, and from 10 weight percent to 30 weight percent of bismuth. Thus, alloys encompassed by the "Sn(70-90)/Bi(10-30)" range include, but are not limited to: Sn(70)/Bi(30), Sn(71)/Bi(29), Sn(72)/Bi(28), Sn(73)/Bi(27), Sn(74)/Bi(26), Sn(75)/Bi(25), Sn(76)/Bi(24), Sn(77)/Bi(23), Sn(78)/Bi(22), Sn(79)/Bi(21), Sn(80)/Bi(20), Sn(81)/Bi(19), Sn(82)/Bi(18), Sn(83)/Bi(17), Sn(84)/Bi(16), Sn(85)/Bi(15), Sn(86)/Bi(14), Sn(87)/Bi(13), Sn(88)/Bi(12), Sn(89)/Bi(11), and Sn(90)/Bi(10). Furthermore, Sn(70-90)/Bi(10-30) represents alloys in which the specific proportion of the elements Sn and Bi may vary from Sn(70)/Bi(30) to Sn(90)/Bi(10) inclusive of proportions of Sn varying from 70 up to 90 weight percent and Bi inversely varying from 30 down to 10 weight percent.

The terms "melting temperature" or "melting point," as used herein, refer to the temperature (a point) at which a solid becomes a liquid at atmospheric pressure.

The terms "high melting temperature metal", "high melting point metal" or "HMP metal" as used herein, refer to a metal having a melting temperature that is equal to, or higher than, about 400° C. HMP metals include Cu, Ag, Pd, Au, Al, Ni, Be, Rh, Co, Fe, Mo, W, Mn and Pt. Typically, the HMP metal used in the present compositions is Cu, Ag, Pd, Au, Al, Ni or Pt, and most frequently the HMP metal is Cu, Ni or Ag.

The terms "low melting temperature metal", "low melting point metal" or "LMP metal" as used herein, refer to a metal having a melting temperature that is lower than about 400° C. Exemplary LMP metals include Sn, Bi, Zn, Ga, In, Te, Hg, Tl, Sb, Se, Po, Pb, Cd, and Po in an alloy of these metals. Typically, the LMP metal used in the present compositions is Sn, Ga, In or Zn in an alloy, and most frequently the LMP is Sn in an alloy.

The term "differential scanning calorimetry" ("DSC") refers to a method of thermal analysis in which the difference in the amount of heat required to increase the temperature of a sample and reference are measured as a function of temperature. DSC is used to investigate the melting behavior of alloy particles and the reaction signature of TLPS pastes formulated with metals and alloys.

The term "sintering" refers to a process in which adjacent surfaces of metal powder particles are bonded by heating. "Liquid phase sintering" refers to a form of sintering in which the solid powder particles coexist with a liquid phase. Densification and homogenization of the mixture occur as the metals diffuse into one another and form new alloy and/or intermetallic species.

In "transient liquid phase sintering" or "TLPS", the liquid phase exists for only a short period of time as a result of the homogenization of the metals to form a mixture of solid alloy and/or intermetallic species. The liquid phase has a very high solubility in the surrounding solid phase, thus diffusing rapidly into the solid and eventually solidifying. Diffusional homogenization creates the final composition without the need to heat the mixture above the solidus temperature of the HMP metal.

The "Coefficient of Thermal Expansion" or "CTE" is a term of art describing a thermodynamic property of a substance. The CTE relates a change in temperature to the change in a material's linear dimensions.

The term "processing temperature" or "T1" as used herein in reference to TLPS compositions is a temperature at which two reactive metals (e.g. Cu and Sn) form intermetallic species. T1 can be, for example, between about 100° C. and about 300° C., and typically is between about 120° C. and about 260° C.

The terms "intermetallics" or "intermetallic species" refer to a solid material, which is comprised of two or more metal atoms in a certain proportion that has a definite structure which differs from those of its constituent metals.

As used herein, "$C_{x-y}$" designates the number of carbon atoms in a chain. For example, ($C_{1-6}$) alkyl refers to an alkyl chain having a chain of between 1 and 6 carbons (e.g., methyl, ethyl, propyl, butyl, pentyl and hexyl). Unless specifically stated otherwise, the chain can be linear or branched.

As used herein, "alkyl" means a linear or branched-chain saturated hydrocarbyl substituent (i.e., a substituent obtained by removal of a hydrogen from a linear or branched-chain saturated hydrocarbon having the general formula $C_nH_{(2n+2)}$, where n is the number of carbon atoms). In one embodiment, from one to six carbon atoms; in another embodiment, from one to four carbon atoms; and in yet another embodiment, from one to three carbon atoms. Non-limiting examples of such substituents include methyl, ethyl, propyl (including n-propyl and isopropyl), butyl (including n-butyl, isobutyl, sec-butyl and tert-butyl), pentyl, isoamyl, hexyl and the like. The alkyl group may be optionally substituted at each hydrogen.

As used herein, "heteroalkyl" means an alkyl having one or more heteroatoms in the carbon chain, wherein each heteroatom is independently selected from among NR, wherein R is hydrogen, alkyl, heteroalkyl, cycloalkyl, heterocycloalkyl, aryl or heteroaryl, or R is absent; NO; S; SO; $SO_2$; and O.

As used herein, "alkenyl" means a linear or branched-chain, mono- or poly-unsaturated hydrocarbyl substituent having at least one carbon-carbon double bond (i.e., a substituent obtained by removal of a hydrogen from a linear or branched-chain mono- or poly-unsaturated hydrocarbon having at least one carbon-carbon double bond). In one embodiment, from two to six carbon atoms; in another embodiment, from two to four carbon atoms; and in yet another embodiment, from two to three carbon atoms. Non-limiting examples of such substituents include vinyl, propenyl, isopropenyl, butenyl, isobutenyl, prenyl, butadienyl, pentenyl, isopentenyl, pentadienyl, hexenyl, isohexenyl, hexadienyl, heptenyl, octenyl, nonenyl, decenyl, undecenyl, dodecenyl, and tridecenyl and the like. The alkenyl group may be optionally substituted at each hydrogen.

As used herein, "heteroalkenyl" means an alkenyl having one or more heteroatoms in the carbon chain, wherein each heteroatom is independently selected from among NR, wherein R is hydrogen, alkyl, heteroalkyl, cycloalkyl, heterocycloalkyl, aryl or heteroaryl, or R is absent; NO; S; SO; $SO_2$; and O.

As used herein, "alkynyl" means a linear or branched-chain, mono- or poly-unsaturated hydrocarbyl substituent having at least one carbon-carbon triple bond and may further have one or more carbon-carbon double bonds (i.e., a substituent obtained by removal of a hydrogen from a linear or branched-chain mono- or poly-unsaturated hydrocarbon having at least one carbon-carbon triple bond). In one embodiment, from two to six carbon atoms; in another embodiment, from two to four carbon atoms; and in yet another embodiment, from two to three carbon atoms. Non-limiting examples of such substituents include ethynyl, propynyl, butynyl, pentynyl, hexynyl, heptynyl, octynyl, nonyl, and decynyl and the like. The alkynyl group may be optionally substituted at each hydrogen.

As used herein, "heteroalkynyl" means an alkynyl having one or more heteroatoms in the carbon chain, wherein each heteroatom is independently selected from among NR, wherein R is hydrogen, alkyl, heteroalkyl, cycloalkyl, heterocycloalkyl, aryl or heteroaryl, or R is absent; NO; S; SO; $SO_2$; and O.

As used herein, "cyano" means a functional group that consists of a carbon atom joined to a nitrogen atom by a triple bond.

As used herein, "cyanoalkyl" means alkyl wherein one or more of the hydrogens is replaced by cyano. The cyanoalkyl group may be optionally substituted at each hydrogen.

As used herein, "alkoxy" means a functional group derived from a linear or branched-chain saturated hydrocarbyl substituent (i.e., a substituent obtained from a hydrocarbon by removal of a hydrogen) which is in turn attached to an oxygen atom. In one embodiment, unless specifically stated otherwise, "alkoxy" has from one to six carbon atoms (i.e., $(C_{1-6})$ alkoxy). In another embodiment, unless specifically stated otherwise, "alkoxy" has from one to three carbon atoms (i.e., $(C_{1-3})$ alkoxy). Non-limiting examples of such alkoxy groups are methoxy, ethoxy, propoxy (including n-propoxy and isopropoxy), butoxy (including n-butoxy, isobutoxy, sec-butoxy and tert-butoxy), pentoxy and the like. The alkoxy group may be optionally substituted at each hydrogen.

As used herein, "heteroalkoxy" means an alkoxy having one or more heteroatoms in the carbon chain, wherein each heteroatom is independently selected from among NR, wherein R is hydrogen, alkyl, heteroalkyl, cycloalkyl, heterocycloalkyl, aryl or heteroaryl, or R is absent; NO; S; SO; $SO_2$; and O.

As used herein, "cyanoalkoxy" means alkoxy wherein one or more of the hydrogens is replaced by cyano.

As used herein, "alkoxyalkyl" means alkyl wherein one or more of the hydrogens is replaced by alkoxy.

As used herein, "cyanoalkoxyalkyl" means alkyl wherein one or more of the hydrogens is replaced by cyanoalkoxy.

As used herein, "cycloalkyl" means a mono-, bi- or poly-cyclic saturated hydrocarbyl (i.e., a substituent obtained by removal of a hydrogen from a mono-, bi- or poly-cyclic saturated hydrocarbon having the general $C_n H_{2(n+1-r)}$, where n is the number of carbon atoms and r is the number of rings). Accordingly, a cycloalkyl may be a single ring, which typically contains from 3 to 7 ring atoms. Examples include, but are not limited to, cyclopropyl, cyclobutyl, cyclopentyl, and cyclohexyl. Alternatively, 2 or 3 rings may be fused together, such as bicyclodecanyl and decalinyl. The term "cycloalkyl" also includes bridged bicycloalkyl systems such as, but not limited to, bicyclo[2.2.1]heptane and bicyclo[1.1.1]pentane. The cycloalkyl group may be optionally substituted at each hydrogen.

As used herein, "heterocycloalkyl" means a cycloalkyl having one or more heteroatoms in the carbon chain, wherein each heteroatom is independently selected from among NR, wherein R is hydrogen, alkyl, heteroalkyl, cycloalkyl, heterocycloalkyl, aryl or heteroaryl, or R is absent; NO; S; SO; $SO_2$; and O.

As used herein, "cycloalkenyl" means a mono-, bi- or poly-cyclic hydrocarbyl having at least one carbon-carbon double bond (i.e., a substituent obtained by removal of a hydrogen from a mono-, bi- or poly-cyclic, mono- or poly-unsaturated hydrocarbon having at least one carbon-carbon double bond). Accordingly, a cycloalkenyl may be a single ring, which typically contains from 3 to 7 ring atoms. Alternatively, 2 or 3 rings may be fused together. The term "cycloalkenyl" also includes bridged bicycloalkenyl systems. Examples include, but are not limited to, norbornenyl, indene-1-yl, indene-2-yl, and indene-3-yl and the like. The cycloalkenyl group may be optionally substituted at each hydrogen.

As used herein, "heterocycloalkenyl" means a cycloalkenyl having one or more heteroatoms in the carbon chain, wherein each heteroatom is independently selected from among NR, wherein R is hydrogen, alkyl, heteroalkyl, cycloalkyl, heterocycloalkyl, aryl or heteroaryl, or R is absent; NO; S; SO; $SO_2$; and O.

As used herein, "cycloalkynyl" means a mono-, bi- or poly-cyclic hydrocarbyl having at least one carbon-carbon triple bond (i.e., a substituent obtained by removal of a hydrogen from a mono-, bi- or poly-cyclic, mono- or poly-unsaturated hydrocarbon having at least one carbon-carbon triple bond). Accordingly, a cycloalkynyl may be a single ring, which typically contains from 3 to 7 ring atoms. Alternatively, 2 or 3 rings may be fused together. The term "cycloalkynyl" also includes bridged bicycloalkynyl systems. Examples include, but are not limited to, cyclobutynyl, cyclopentynyl, and cyclohexynyl. The cycloalkynyl group may be optionally substituted at each hydrogen.

As used herein, "heterocycloalkynyl" means a cycloalkynyl having one or more heteroatoms in the carbon chain, wherein each heteroatom is independently selected from among NR, wherein R is hydrogen, alkyl, heteroalkyl, cycloalkyl, heterocycloalkyl, aryl or heteroaryl, or R is absent; NO; S; SO; $SO_2$; and O.

As used herein, "aryl" means a functional group derived from a carbocyclic aromatic system containing one or more rings wherein such rings may be fused. If the rings are fused, one of the rings must be fully unsaturated and the fused ring(s) may be fully saturated, partially unsaturated or fully unsaturated. The term "fused" means that a second ring is present (i.e., attached or formed) by having two adjacent atoms in common (i.e., shared) with the first ring. The aryl group may be optionally substituted. The term "aryl" includes aromatic radicals such as phenyl, naphthyl, tetrahydronaphthyl, indanyl, biphenyl, anthracenyl, benzo[b][1,4]oxazin-3(4H)-onyl, 2,3-dihydro-1H indenyl and 1,2,3,4-tetrahydronaphthalenyl. Aryls may be optionally substituted at each hydrogen.

As used herein, "heteroaryl" means an aryl having one or more heteroatoms in the carbon chain, wherein each heteroatom is independently selected from among NR, wherein R is hydrogen, alkyl, heteroalkyl, cycloalkyl, heterocycloalkyl, aryl or heteroaryl, or R is absent; NO; S; SO; $SO_2$; and O.

As used herein, "cyanoaryl" means aryl wherein one or more of the hydrogens is replaced by cyano.

As used herein, "substituted" means that one or more hydrogen atoms are replaced with suitable functional groups. Suitable functional groups for substitution at a carbon atom include, but are not limited to, deutero, hydroxy, cyano, alkyl (optionally further substituted), heteroalkyl (optionally further substituted), alkenyl (optionally further substituted), heteroalkenyl (optionally further substituted), alkynyl (optionally further substituted), heteroalkynyl (optionally further substituted), alkoxy (optionally further substituted), heteroalkoxy (optionally further substituted), cycloalkyl (optionally further substituted), heterocycloalkyl (optionally further substituted), cycloalkenyl (optionally further substituted), heterocycloalkenyl (optionally further substituted), cycloalkynyl (optionally further substituted), heterocycloalkynyl (optionally further substituted), aryl (optionally further substituted), heteroaryl (optionally further substituted) and the like. Suitable functional groups for substitution at a nitrogen atom include, but are not limited to, deutero, alkyl (optionally further substituted), heteroalkyl (optionally further substituted), alkenyl (optionally further substituted), heteroalkenyl (optionally further substituted), alkynyl (optionally further substituted), heteroalkynyl (optionally further substituted), cycloalkyl (optionally further substituted), heterocycloalkyl (optionally further substituted), cycloalkenyl (optionally further substituted), heterocycloalkenyl (optionally further substituted), cycloalkynyl (optionally further substituted), heterocycloalkynyl (optionally further substituted), aryl (optionally further substituted), heteroaryl (optionally further substituted) and the like. Suitable functional groups for substitution at an oxygen atom include, but are not limited to, deutero, alkyl (optionally further substituted), heteroalkyl (optionally further substituted), alkenyl (optionally further substituted), heteroalkenyl (optionally further substituted), alkynyl (optionally further substituted), heteroalkynyl (optionally further substituted), cycloalkyl (optionally further substituted), heterocycloalkyl (optionally further substituted), cycloalkenyl (optionally further substituted), heterocycloalkenyl (optionally further substituted), cycloalkynyl (optionally further substituted), heterocycloalkynyl (optionally further substituted), aryl (optionally further substituted), heteroaryl (optionally further substituted) and the like.

As used herein, "substantially free" means less than about 0.5%, preferably less than about 0.1%, and more preferably less than about 0.05%.

As used herein, CRAYVALLAC™ Ultra, available from Cray Valley Company, is a polyamide type thixotropic agent.

The section headings used herein are for organizational purposes and are not to be construed as limiting the subject matter described. All documents, or portions of documents, cited in this application, including, but not limited to, patents, patent applications, articles, books, and treatises, are hereby expressly incorporated herein by reference in their entirety for any purpose. In the event that one or more of the incorporated literature and similar materials defines a term in a manner that contradicts the definition of that term in this application, this application controls.

DETAILED DESCRIPTION

It is to be understood that both the foregoing general description and the following detailed description are illustrative and explanatory, and are not restrictive of the subject matter, as claimed.

The present invention relates to electrically and/or thermally conductive adhesive materials with long work or pot lives in combination with low solvent contents. Accordingly, the present invention provides adhesive materials having a unique combination of mechanical, electrical and thermal properties with sufficient work lives for commercial (e.g., high volume) applications, while utilizing low solvent contents.

Compositions of the Invention

Invention compositions are a replacement for soft solder and metal-filled polymers in the attachment of semiconductor die to packaging elements. High volumetric metal loading and low porosity of the compositions provides superior mechanical, electrical and thermal interconnection performance between the semiconductor and metal packaging elements.

In the instant compositions, the use of specific organic constituents to facilitate the thermal processing of the metallic constituents into a contiguous network results in paste compositions that do not require the use of an additional diluent to achieve a favorable paste consistency. Further, in some embodiments, the specific organic constituents employed also obviate the need to incorporate many of the chemical additives used in the known solder paste and TLPS compositions. The resulting reduction in residual organic content in joints formed from the instant compositions, particularly in comparison to known TLPS compositions, confers the advantage of enabling higher electrical and thermal conductivity performance resulting from a predominantly metallic joint.

In the instant compositions, particles of a metal are admixed with lead-free metal alloy particles in a fluxing vehicle. At least one element within the lead-free metal alloy particles is reactive with the metal in the metal particles. As the temperature is raised to the melting point of the lead-free metal alloy particles, the lead-free metal alloy particles become molten. The diffusion and reaction of the reactive element(s) from the lead-free metal alloy particles and the receptive metal particles continues until the reactants are fully depleted, there is no longer a molten phase at the process temperature, or the reaction is quenched by cooling the mixture. After cooling, the volume fraction of metal in the reacted material exceeds 60% of the total volume, and/or total volume fraction of voids in the reacted material is less than 10%. Subsequent temperature excursions of the reacted composition, even beyond the original melt temperatures, do not reproduce the original melt signature of the mixture.

The compositions overcome the problems of large voids and remelt in solder die attach materials, as well as the poor thermal performance from the passively loaded conductive adhesive compositions with relatively low metal loading percentages, while also providing conformance to common manufacturing schemes and compatibility with popular surface finishes. In the compositions, metal particles are blended with lead-free solder paste compositions and diluted with a fluxing vehicle such that the net metal content after thermal processing is in excess of 60 volume percent. The compositions can be prepared in a paste consistency to facilitate application by common industry methods, such as dispensing and stencil printing. Once the paste is applied and the semiconductor and packaging element(s) have been assembled in the desired configuration, the assembly is subjected to a thermal excursion under a controlled thermal ramp and environment. During this thermal processing, the volatile portion in the fluxing vehicle is slowly evaporated, lead-free metal alloy particles melt, the LMP metal Y in the molten alloy diffuses into the adjacent surfaces of the metallic element M and reacts to form high-melting alloys. The remaining fluxing vehicle, and the flux chemistry filling the interstices between the particles, thermosets and becomes chemically inert. The resultant composition contains at least about 60% by volume metallurgically interconnected metal.

The compositions are superior to conventional particle-filled adhesives because the mechanical strength and the thermal and electrical performance are derived from the high volumetric loading of metallurgically interconnected pathways formed by the interdiffusion of the LMP metal (e.g., tin) in the lead-free alloy particles into the solderable surfaces of the semiconductor die, the package element(s), and the metal particles. In conventional particle-filled adhesives, the volumetric metal loading is constrained by the need to maintain the mechanical integrity of the polymer adhesive.

The compositions are superior to conventional lead-containing and lead-free solders because the compositions are lead-free and will not remelt when exposed to subsequent solder reflow profiles during component assembly to a module or printed circuit board.

The compositions differ from prior art compositions in that compositions have been specifically designed to meet the unique challenges of power semiconductor die attach such as very low void volume and a high volume of densely interconnected metal for high thermal and electrical performance. First, the low void percentage is a function of the controlled volatilization of the volatile fraction of the flux vehicle over the defined thermal processing regime. Further, the high volume fraction of interconnected metal is achieved by minimizing the non-volatile fraction of the fluxing vehicle and optimizing the ratio between lead-free metal alloy particles and metal particles. Finally, the particle size of the metal powders in the composition have been selected to provide improved bonding control and ease of application for die attach applications.

In the simplest terms the semiconductor die attach composition is a composition of metal powders and fluxing vehicle that, once reacted, forms a metallurgically interconnected network containing at least 60% volumetric metal (alloy+metal powder) fraction and/or less than 10% volume fraction of voids. The composition comprises:
 a. 80-99 percent by weight (wt %) of a mixture of metal particles comprising:
  i. 30-70 wt % of a lead-free, low melting point (LMP) particle composition comprising at least one LMP metal Y; and
  ii. 25-70 wt % of a high melting point (HMP) particle composition comprising at least one metallic element M that is reactive with the at least one LMP metal Y at a process temperature T1,
   wherein the ratio of wt % of M to wt % of Y is at least 1.0,
 b. 0-30 wt % of a metal powder additive A and
 c. a fluxing vehicle, wherein said fluxing vehicle comprises:
  i. a fatty acid;
  ii. an optional amine;
  iii. an optional triglyceride; and
  iv. optional functional additives.

In the practice of the invention, lead-free metal alloy particles, metal powder and fluxing vehicle can be mixed together to form a printable or dispensable paste. Typically, the mixture of lead-free metal alloy and metal particles will be present in at least about 80, or at least about 85, weight percentage of the composition and up to about 90, or up to about 95, or up to about 99, weight percentage of the composition. Typically, the lead-free metal alloy powder will be present in at least about 20, or at least about 30, weight percentage of the mixture and up to about 50, or up to about 60, or up to about 70, weight percentage of the mixture. Typically, the metal powder will be present in at least about 30, or at least about 40, weight percentage of the mixture and up to about 70, or up to about 80, weight percentage of the mixture. Typically, the fluxing vehicle will be present up to about 20, or up to about 10, or up to about 5, weight percent of the composition, of which not more than about 50, or about 25, or about 10, or about 5, weight percent of fluxing vehicles is non-volatile. Typically, the ratio of weight percentage of M to the weight percentage of Y in the composition is at least about 1.0, or at least about 1.3, or at least about 1.5.

The compositions can be advantageously used to connect the topside and/or backside of semiconductor chips to semiconductor packaging elements such as clips, lead frames or other substrates. The compositions are most advantageously used to form assemblies wherein both the topside and/or backside of the semiconductor chip and packaging element(s) are metallized with a solderable surface to facilitate thermal transfer and/or an electrical connection between the semiconductor chip and packaging elements. This configuration enables the compositions to form a continuous metallurgically interconnected pathway from the metallization on the semiconductor die, through the bulk of the joint, and to the metallization on the package element.

The compositions may be paste-based or converted to a film. The compositions may be screen or stencil printed, dispensed, jetted, pick-and-placed, laminated and the like, to form patterned deposits on the semiconductor chip surface, packaging element surface, or on a temporary carrier to which the semiconductor chip and packaging elements may then be attached. Volatiles that are present in the flux vehicle composition are evolved either in a b-staging process or during a ramp in temperature to the peak temperature T1. T1 is equal to or greater than the melting temperature of lead-free metal alloy particles. In solder reflow, the peak reflow temperature is typically selected to be 5-50° C. in excess of the melting temperature of lead-free metal alloy particles to ensure that all the particles become molten and fluid. This peak temperature is also appropriate for the compositions, but a longer total process cycle time may be required to affect the evolution of the volatile constituents for a desired low volume percentage of voids and to develop the interdiffused metallurgical structure.

During the thermal processing excursion of compositions, the LMP metal (e.g., tin) in lead-free metal alloy particles undergoes interdiffusion with the remaining metal particles in the composition resulting in the irreversible formation of new alloy compositions with melting temperatures vastly in excess of the reflow processing temperature. It is this feature that enables compositions to be used for semiconductor die attach into a packaged component without remelting during subsequent reflow operations when the packaged component is assembled to a circuit board.

Lead-free metal alloy particles may also contain elements that are non-reactive with the metal particles. Typical elements that may be alloyed with the reactive element may include Bi, Ag, Cu, Sb, Au or combinations thereof. Typically, these additional, non-reactive elements are incorporated to achieve a particular process temperature, to improve wetting to preferred metallic surfaces such as copper, or to manipulate the mechanical properties of the thermally processed composition. Specific alloying elements may be advantageous in one aspect, such as affording a low process temperature, but detrimental in another aspect such as wetting and adhesion to particular surface finishes. The specific alloying elements are, therefore, specific to the particular requirements of the application.

The presence of voids in the finished joint between the semiconductor die and the package element is generally detrimental to the thermal performance and may create an initiation point for mechanical failure. The composition may be processed in a manner similar to the thermal profiles typically used for solders or in a manner consistent with a conductive adhesive. The thermal profile used should be selected to limit the total volume of voids in the reacted composition to less than about 10%, or less than about 5%. The cooling rate from the peak temperature of the profile to room temperature should be selected to prevent damage to the semiconductor chip as a result of thermal shock, and, for example, is less than about 6° C. per second, or between about 2.17 and about 3.25° C. per minute. It will be appreciated that the optimal cooling rate may depend on the type of processing employed (e.g., much slower in adhesive-type processing than for reflow-type processing) and the specific semiconductor die and package form factors.

Thermosetting Properties of TLPS Compositions

The present compositions are based on the observation that TLPS compositions can be processed at a temperature, T1, to connect electronic components and the resulting processed connections will be stable upon subsequent heating to temperature T1 and even higher temperatures. In other words, once metallurgically processed, TLPS compositions do not melt when heated beyond the process temperature. Thus, the TLPS compositions behave like "thermosets", rather than "thermoplastics".

The skilled artisan will recognize that "thermosets" irreversibly "cure" upon application of heat to become insoluble, hardened forms, while "thermoplastics" melt when heated, solidify when sufficiently cooled and can be remelted and resolidified repeatedly. Although this terminology is typically used to describe polymer adhesives, it is used herein to describe metallurgical compositions used to connect, for example, electronic components and other metallic elements.

Conventional metallic solder can be characterized as "thermoplastic". Solder is melted to join metal parts together and solidifies upon cooling to hold those parts in place; yet when subsequently reheated, solder re-melts. In contrast, TLPS compositions behave like thermosets. When heated, TLPS compositions melt sufficiently to join metal parts together, and solidify upon cooling to hold those parts in place. However, during the melting process, TLPS compositions undergo irreversible metallurgical changes that can be considered "curing" with the result that the "cured" or processed TLPS composition will not melt upon re-heating.

In certain embodiments of the invention, conventional solder pastes containing low melting point (LMP) lead-free metal alloys, are combined with reactive metal particles in proportions that convert the solder to a "thermosetting" form, which irreversibly "cures" during a typical solder reflow cycle. This "thermosetting" behavior results in a joint that does not remelt at the original reflow temperature and thus is suitable for secondary assembly cycles at the same reflow temperature as well as for high operating temperature applications.

In conventional solder reflow, the reflow temperature is typically selected to be 5-50° C. in excess of the melting temperature of the solder paste to ensure that all the particles become molten and fluid. When the present compositions are used in place of solder paste for the attachment of electronic components, standard solder reflow practices may be followed.

In the practice of the invention, the high-melting-point metal M, and at least one LMP metal Y, are selected so that the products of the transient liquid phase sintering reaction will have the optimum combination of attributes for the intended application. Key attributes that may be contemplated for the selection of M encompass characteristics such as thermally stable resistance, ductility, high electrical and thermal conductivity, coefficients of thermal expansion similar to the surrounding materials, and others that may be desirable under specific circumstances.

The compositions undergo a thermosetting reaction under solder reflow conditions to form a mixture of crystalline intermetallic and alloy products (i.e., new alloys formed during TLPS reaction) that all have substantially higher melting temperatures than the initial lead-free metal alloy particle melt temperature, and vastly in excess of reflow processing temperatures. The alloy products formed during TLPS processing have a substantially different composition than the original mixture of LMP and HMP metal particles. This reaction is irreversible and the processed composition does not melt significantly during subsequent high temperature exposures. It is this feature that enables compositions to be used for standard reflow attachment of electronic components without remelting during subsequent reflow operations. The compositions, therefore, enable step soldering operations and high operating temperature electronic assemblies to be fabricated under standard industry solder reflow conditions without the use of lead, expensive elements such as gold, or exotic alloys.

The crystalline intermetallics that are formed during solder reflow using the compositions comprise unit cells of fixed elemental proportions and structure in a multiplicity that defines a grain size. Crystalline intermetallics are strong, but brittle materials. When intermetallics are formed at the interface between a standard solder paste and a components attachment pad, large grains are typically grown with laminar interfaces with the pad and bulk solder. These laminar interfaces are susceptible to crack formation and propagation. With the compositions; however, the reactive metal powder nucleates a large multiplicity of small disordered grains in different orientations. The growth of this multiplicity of grains is limited by the volume of reactive metal in each particle. The random orientation of each grain prevents the small grains from merging into a few large grains. This multiplicity of small, disordered grains promotes the formation of a strong joint that is not as susceptible to crack propagation as would a few large grains along a laminar interface.

Typically, the heat of fusion of the composition at the melting temperature of lead-free metal alloy particles is reduced by at least 70% during the initial solder reflow process. During initial processing, the TLPS composition exhibits a significant heat of fusion peak at the melting temperature of the lead-free metal alloy particles. After processing, the heat of fusion upon reheating to the melting temperature of the lead-free metal alloy is reduced substantially even when normalized for the proportion in the total composition.

The energy required to change a gram of a substance from the solid to the liquid state without changing its temperature is called heat of fusion. The heat of fusion for any material is specific to that material. The expression of heat of fusion of the LMP metal within a TLPS composition will be dependent on the proportion of the LMP metal in the total composition. The depletion of the LMP metal phase in any given TLPS composition after processing, due to the reaction of M and Y to form intermetallic species, may be determined by comparing the heat of fusion of a sample of the unprocessed composition to that of one that has been processed at T1. Because the heat of fusion of the LMP metal in the unprocessed composition may be masked by the vigorous energy release associated with the TLPS reaction of Y and M, it is often useful to use the heat of fusion of pure LMP metal and then normalize this value according to the weight percentage of LMP metal in the composition to obtain a value for the unprocessed TLPS composition.

High Melting Point Metals

HMP metals (M) include, but are not limited to, Cu, Ag, Pd, Au, Al, Ni, Be, Rh, Co, Fe, Mo, W, Mn and Pt. Typically, the HMP metal used in the compositions of the present is Cu, Ag, Pd, Au, Al, Ni or Pt, and most frequently the HMP metal is Cu, Ni or Ag. The HMP particles comprising M may be substantially elemental M, may be M alloyed with other elements, may be M coated onto a non-metallic or other core particle, or may be M coated itself with another element, inorganic coating or organic coating. The use of multiple HMP metals is contemplated in order to obtain TLPS reaction products with optimal characteristics. For instance, in some applications the mechanical strength of the processed composition is less important than the electrical conductivity, or the thermal conductivity may be more important than the ductility. As it is often necessary to optimize one property at the expense of another, the individual constituents may be selected to give optimal performance in the intended application according to properties of the elements that are well-known in the art. Silver, gold, palladium, nickel and aluminum are specifically contemplated for use in the compositions and methods of the invention, either alone or in various combinations, including combinations with copper.

In the present composition, Cu is the preferred element for (M), although other metals are contemplated as the application warrants. The use of additional high melting point metals in combination with the copper is also contemplated in order to obtain metallic reaction products with the lead-free solder with optimal characteristics such as a low CTE or composite modulus. Ag, Au, Pd, Ni, Al, Fe, Mn, Mo, and W are also specifically contemplated for use as the primary or an alloying metal element.

The high melting point metal can be present as a mixture having one, two or more average distributions of particle sizes. For example, the high melting point metal can be present as a first high melting point metal having a first average distribution of particle sizes and a second high melting point metal having a second average distribution of particle sizes.

In addition, the high melting point metal can be present in a passivated or unpassivated form. Passivation can be achieved by exposing the high melting point metal to any of a variety of known corrosion inhibitors. Such corrosion inhibitors may be applied as coatings to the high melting point metal, by incorporation into the flux vehicle, or a combination thereof.

Low Melting Point Metals

Ideally, to substitute in existing lead-free solder reflow processing in use by the electronics industry, the LMP metal used in the present TLPS compositions is one that is commonly used in the fabrication of lead-free solder pastes. Exemplary LMP solder paste alloys (Y/X) include, but are not limited to, Sn/Ag/Cu, Sn/Cu, Sn/Ag, Sn/Sb, Sn/In, Sn/Bi, Sn/Bi/Ag. While it is advantageous to use commercially available alloys, the present compositions can be prepared with any suitable alloy. The exact proportions of the constituents may vary and custom alloys are contemplated by the invention. In the representation "Y/X" for lead-free metal alloy particles, "X" represents at least one metal that forms an alloy with Y. In some embodiments of the invention, X represents one, two, three or more alloying metals. For example, Y/X is used herein to represent various alloys of Y in where Y is tin, and X is a single metal, for example, copper (Sn/Cu), silver (Sn Ag), antimony (Sn/Sb), indium (Sn/In), and bismuth (Sn/Bi). Y/X is also used to represent various alloys of Y is tin and X represents two metals, such as silver and copper (Sn/Ag/Cu; e.g., SAC), and silver and bismuth (Sn/Bi/Ag).

Exemplary reactive elements (Y) in LMP lead-free metal alloys include the following metals: Sn, Zn, Ga, In, alone or in an alloy form with (X). Typically, Y in the present compositions is Sn, or In and most frequently the Y is Sn in an alloy form Y/X. In certain embodiments of the invention, the reactive metal Y is Sn, which is present in the form of a low melting temperature alloy Y/X, and the reactive HMP metal M is Cu, Ni or Ag. In one embodiment of the invention, Y/X is SAC (Sn/Ag/Cu) and M is Cu.

Exemplary high melting point metals, low melting point metals and alloys comprising the same can be found in, but are not limited to those described in, U.S. Pat. Nos. 5,830,389, 5,853,622, 8,840,700 and 9,583,453, each of which is hereby incorporated herein in its entirety.

Fatty Acids

Any of a variety of known fatty acids or mixtures thereof can be used in the present compositions. In one embodiment, the fatty acid comprises a compound having the formula:

wherein $R_1$ is selected from the group consisting of unsubstituted or substituted ($C_{2-38}$) alkyls, unsubstituted or substituted ($C_{2-38}$) alkenyls, and unsubstituted or substituted ($C_{2-38}$) alkynyls. In one particular embodiment, the fatty acid comprises octanoic acid.

In particular variations where good mixing and/or viscosity are desired, the fatty acid is liquid at room temperature. In other particular variations, the fatty acid has a boiling point in excess of the lead-free solder reflow temperature for the second metallic component. In still other particular variations, the fatty acid has a boiling point in excess of the lead-free solder reflow temperature for SAC (i.e., 218° C.). In yet other particular variations, the fatty acid and the amine, when mixed, form a liquid at room temperature (i.e., 25° C.).

Amines

Compositions employing a fatty acid by itself as a matrix/binder tend to lose fluidity quickly at room temperature when in contact with metal powders, since they can react to form metal carboxylates. Accordingly, the addition of an amine is sometimes useful addition to neutralize the fatty acid by forming a fatty acid salt, which has very stable shelf life and work life.

Any of a variety of known amines or mixtures thereof can be used in the present compositions provided that such amines maintain the liquidity of the flux vehicle and do not adversely affect other key characteristics. In some embodiments, the amine is a tertiary amine.

In some embodiments, the amine comprises a compound having the formula:

wherein:

X is selected from the group consisting of unsubstituted or substituted ($C_{1-6}$) alkylenes; and $R_2$, $R_3$, $R_4$ and $R_5$ are each independently selected from the group consisting of hydrogen, hydroxyl, unsubstituted or substituted ($C_{1-6}$) alkyls, unsubstituted or substituted ($C_{1-6}$) alkenyls, and unsubstituted or substituted ($C_{1-6}$) alkynyls.

In one particular embodiment, X is propylene. In another particular embodiment, X is ethylene.

In still another particular embodiment, $R_2$ is selected from the group consisting of hydroxyl, unsubstituted or substituted (C$_{1-6}$) hydroxyalkyls, unsubstituted or substituted (C$_{1-6}$) hydroxyalkenyls, and unsubstituted or substituted (C$_1$-6) hydroxyalkynyls.

In yet another particular embodiment, R$_3$ is selected from the group consisting of hydroxyl, unsubstituted or substituted (C$_{1-6}$) hydroxyalkyls, unsubstituted or substituted (C$_{1-6}$) hydroxyalkenyls, and unsubstituted or substituted (C$_1$-6) hydroxyalkynyls.

In another particular embodiment, R$_4$ is selected from the group consisting of hydroxyl, unsubstituted or substituted (C$_{1-6}$) hydroxyalkyls, unsubstituted or substituted (C$_{1-6}$) hydroxyalkenyls, and unsubstituted or substituted (C$_1$-6) hydroxyalkynyls.

In still another particular embodiment, R$_5$ is selected from the group consisting of hydroxyl, unsubstituted or substituted (C$_{1-6}$) hydroxyalkyls, unsubstituted or substituted (C$_{1-6}$) hydroxyalkenyls, and unsubstituted or substituted (C$_1$-6) hydroxyalkynyls.

In yet another particular embodiment, R$_2$, R$_3$, R$_4$ and R$_5$ are each hydroxyl.

In one specific embodiment, the amine comprises n,n,n',n'-tetrakis(2-hydroxyethyl)ethylenediamine. In another specific embodiment, the amine comprises n,n,n',n'-tetrakis(2-hydroxypropyl)ethylenediamine.

In other embodiments, the amine comprises a compound having the formula NR$_{10}$R$_{11}$R$_{12}$, wherein R$_{10}$, R$_{11}$, and R$_{12}$ are each independently selected from the group consisting of hydrogen, hydroxyl, unsubstituted or substituted (C$_{1-6}$) alkyls, unsubstituted or substituted (C$_{1-6}$) alkenyls, and unsubstituted or substituted (C$_{1-6}$) alkynyls. In still another particular embodiment, R$_{10}$, R$_{11}$, and R$_{12}$ are each independently selected from the group consisting of hydroxyl, unsubstituted or substituted (C$_{1-6}$) hydroxyalkyls, unsubstituted or substituted (C$_{1-6}$) hydroxyalkenyls, and unsubstituted or substituted (C$_{1-6}$) hydroxyalkynyls. In yet another particular embodiment, R$_{10}$, R$_{11}$ and R$_{12}$ are each unsubstituted or substituted (C$_{1-6}$) hydroxyalkyls.

Exemplary amines and formulations comprising amines can be found in, but are not limited to those described in, U.S. Pat. Nos. 7,858,074, 6,855,776 and 6,831,136, and US Patent Publication No. 2005/256262, each of which is hereby incorporated herein by reference in its entirety.

In particular variations, where good mixing and/or viscosity are desired, the amine is liquid at room temperature. In other particular variations, the amine has a boiling point in excess of the lead-free solder reflow temperature for the second metallic component. In still other particular variations, the amine has a boiling point in excess of the lead-free solder reflow temperature for SAC (i.e., 218° C.). In yet other particular variations, the fatty acid and the amine, when mixed, form a liquid at room temperature (i.e., 25° C.).

Triglycerides

The addition of one or more triglycerides can provide long work-life of the fluxing system. In addition, the low-viscosity of the triglyceride can work to reduce the final paste rheology. Accordingly, the particle mixture composition optionally further comprises a triglyceride. In one embodiment, the triglyceride comprises a compound having the formula:

wherein R$_7$, R$_8$, and R$_9$ are each independently selected from the group consisting of monovalent radicals derived from fatty acids, unsubstituted or substituted (C$_{2-38}$) alkyls, unsubstituted or substituted (C$_{2-38}$) alkenyls, unsubstituted or substituted (C$_{2-38}$) alkynyls, unsubstituted or substituted (C$_{2-38}$) carboxyalkyls, unsubstituted or substituted (C$_{2-38}$) carboxyalkenyls, and unsubstituted or substituted (C$_{2-38}$) carboxyalkynyls.

In one variation, R$_7$ is a saturated or an unsaturated aliphatic chain ranging from 2-38 carbons in length. In another variation, R$_8$ is a saturated or an unsaturated aliphatic chain ranging from 2-38 carbons in length. In still another variation, R$_9$ is a saturated or an unsaturated aliphatic chain ranging from 2-38 carbons in length.

In one particular variation, R$_7$, R$_8$, and R$_9$ each independently comprise a compound having the formula:

wherein Y is selected from the group consisting of unsubstituted or substituted (C$_{1-20}$) alkylene and unsubstituted or substituted (C$_{1-20}$) alkenylene; and ∿∿∿ represents a point of attachment. In one particular embodiment, Y is an unsubstituted or substituted (C$_{5-10}$) alkylene.

In one specific embodiment, the triglyceride comprises glyceryl trioctanoate.

If present, the triglyceride may be added to the composition in an amount of less than about 2.0% by weight, preferably less than about 1.0% by weight, and more preferably less than about 0.5% by weight.

Additives

Particulate additives may be incorporated to modify the physical characteristics of the processed composition, alter color or refraction of the processed composition, or to aid in the use of certain deposition methods (i.e., jetting). Examples of particulate additives that are contemplated for use include silica, metal powders other than the HMP and LMP, carbon black; oxide colors and titanium dioxide; light weight microballoons; glass microspheres; and carbon and polymer microballoons. When present, particulate additives may further comprise metallic or non-metallic coatings as the application warrants.

Waxy solids, such as castor oil derivatives, polyamide waxes, stearates, and the like; may be incorporated to manipulate the rheological behavior and lubricity of the paste.

In addition, a variety of organic additives are contemplated to impart attributes that would facilitate use in specific applications. Organic additives are commonly used as thixotropic agents; flow control agents, adhesion promoters, antioxidants and light stabilizers, anti-corrosives, surfactants, and antifoaming agents. The proportion and form of such additives may be controlled to achieve the specific feature enhancement of the instant compositions to be suitable for a particular application.

The incorporation of additives or additive coatings may be selected to service application requirements such as deposition method, processing method, compatibility with a particular surface, protection from the ambient environment during processing, extended worklife, reliability requirements for the processed composition, and the like.

If present, each additive may be added to the composition in an amount of less than about 1.0% by weight, preferably less than about 0.5% by weight, and more preferably less than about 0.25% by weight.

Methods of Preparing

The present compositions can be prepared using any of a variety of known techniques to combine a predetermined ratio of the first metallic component, the second metallic component and the fatty acid to form a mixture thereof.

In embodiments that are substantially solvent-free, a vacuum is optionally pulled on the material after mixing in order to remove trapped gas from the material. In particular variations, the material remains in vacuum until substantially all of the gas bubbles have been removed (e.g., about 10 minutes).

After mixing, the material can be loaded into syringes for ease of use.

Uses

The metallurgical networks formed from the present TLPS compositions are useful for electrically, thermally and/or mechanically connecting elements within electrical structures. The present compositions provide for connecting a variety of electronic parts for applications where high operating temperatures may be encountered, including but not limited to step-soldering, down-hole, oil drilling, electronic controls, automotive underhood, smart-grid distribution, and aerospace applications.

Exemplary applications in which inventive compositions may be used include connecting semiconductor dies to packaging elements, forming connections between stacked die, thermal interface materials, and the like.

The present compositions can be advantageously used to connect metallized semiconductor die to leads, circuit boards, lead frames, clips, interposers, additional die, or other substrates. The present compositions are most advantageously used to connect semiconductor die when the assemblies thus connected will be subjected to a subsequent assembly operation that requires another solder reflow and/or when the assembly will be used in a harsh operating environment. In particular, the present compositions can be used to attach light emitting diodes (LEDs; e.g., sapphire-based, flip-chip LEDs) to substrates (e.g., ceramic substrates)).

The above-described compositions can be applied using various techniques, including, but not limited to, needle dispensing, stenciling, screen printing, ink jetting, lamination, extrusion, casting, spraying or other methods that would be known to those of skill in the art, such as methods that form patterned deposits to which electronic components may then be attached. Once applied, the described compositions are thermally processed in an oven, in a reflow furnace, on a hot plate, in a lamination press, or by other means typically employed for the processing of solder or metal filled organic adhesives. The specific thermal process conditions are dependent upon the application as well as selection of the metal system and any organic binder constituents.

After deposition, metallic semiconductor die or packaging elements are contacted with the deposited composition to form an assembly. The present compositions may then be thermally processed to a temperature T1 in an oven, in a reflow furnace, in thermocompression equipment, on a hot plate, in a lamination press, or by any other available means, such as means typically employed for the processing of solder or filled organic adhesives. The skilled artisan will be aware of additional methods that are typically employed for the processing of solder or filled organic adhesives that will be suitable for processing the TLPS compositions described herein. The specific thermal process conditions are dependent upon the application, intended use, the TLPS composition and any fluxing organic vehicle constituents. Typically, process temperature T1 is in the range from 100° C. to 300° C., more often in the range of 150° C. to 280° C., and most often in the range of 200° C. to 280° C.

EXAMPLES

Reference will now be made to more specific embodiments of the present disclosure and experimental results that provide support for such embodiments. However, Applicants note that the disclosure below is for illustrative purposes only and is not intended to limit the scope of the claimed subject matter in any way.

Example 1

The Flux System of Table 1 was prepared by mixing octanoic acid and Crayvallac™ Ultra, heating the mixture to 65° C., and then shearing the mixture in a speedmixer.

TABLE 1

| Ingredient | Mass (g) | Weight % |
| --- | --- | --- |
| Octanoic Acid | 20 | 98% |
| Crayvallac ™ Ultra | 0.41 | 2% |

Example 2

The Flux System of Table 2 was prepared by mixing octanoic acid and N,N,N',N'-Tetrakis(2-hydroxyethyl)ethylenediamine, heating the mixture to 125° C., and then degassing under vacuum.

TABLE 2

| Ingredient | Mass (g) | Weight % |
| --- | --- | --- |
| Octanoic Acid | 10 | 55% |
| N,N,N',N'-Tetrakis(2-hydroxyethyl)ethylenediamine | 8.19 | 45% |

Example 3

The flux vehicles in Table 3 were all prepared through mixing in the proportions detailed. Flux vehicles 2-4 were allowed to exotherm and to cool back to room temperature before usage. All flux vehicles in Table 6 retain a viscosity that is conducive to compounding into high-metal load paste. Flux Vehicle 1 has a particularly low viscosity, and can be utilized for pastes suitable for automated printing at loading levels of only 4 wt % without any additional rheology modifiers. Flux vehicles 2-4 are also low viscosity, but usable for automated printing operations at loading levels of 7 wt % without any additional ingredients.

TABLE 3

| Ingredient | Mass (g) | Weight % |
|---|---|---|
| Flux Vehicle 1 | | |
| Octanoic Acid | 20 | 98% |
| Crayvallac ™ Ultra | 0.41 | 2% |
| Flux Vehicle 2 | | |
| Octanoic Acid | 10 | 55% |
| N,N,N',N'-Tetrakis(2-hydroxyethyl)ethylenediamine | 8.19 | 45% |
| Flux Vehicle 3 | | |
| Octanoic Acid | 10 | 50% |
| N,N,N',N'-Tetrakis(2-Hydroxypropyl)ethylenediamine | 10.12 | 50% |
| Flux Vehicle 4 | | |
| Octanoic Acid | 10 | 49% |
| Triethanolamine | 10.33 | 51% |

Comparative Example 1

Flux vehicle 5 in Table 4 was prepared through mixing in the quantities detailed and allowing the mixture to exotherm and cool to room temperature. During the exothermic reaction, the mixture underwent a solidification reaction rendering it unusable for the purposes of preparing a paste. This combination of fatty acid and amine was found to be unsuitable for solvent-free formulating.

TABLE 4

| Flux Vehicle 5 | | |
|---|---|---|
| Ingredient | Mass (g) | Weight % |
| Octanoic Acid | 10 | 73% |
| N-(2-Hydroxyethyl)ethylenediamine | 3.61 | 27% |

Example 4

For the formulation of Table 5, SAC305 was obtained from Indium Corporation. The formulation of Table 5 was prepared using Flux Vehicle 3 by mixing the ingredients using shear blades until homogenous. Vacuum was pulled on the material after mixing and the material remained in vacuum until it no longer bubbled (about 10 minutes). The material was weighed out into 30 g aliquots and packed into syringes.

TABLE 5

| Ingredient | Mass (g) | Weight % |
|---|---|---|
| Copper (3 μm) | 10 | 29.1% |
| Copper (8 μm) | 10 | 29.1% |
| SAC (5-15 μm) | 12 | 34.8% |
| Flux System | 2.41 | 7.00% |

The paste mixture of the formulation of Table 5 was applied to a gold-backed silicon semiconductor die by dispensing through a syringe to form a 50 micron thick layer of paste on the die when sandwiched between a second gold-backed silicon die. The entire gold-metalized surface of the die was coated. In one test for characterizing thermal conductivity, two 6 mm×6 mm gold-backed silicon adherents were sinter bonded in a nitrogen environment using a solder reflow profile with a peak temperature of 235° C. for 5 minutes. Upon cooling, the sintered assemblies were tested for thermal diffusivity in a "three-layer" configuration using a Netzsch LFA467. The test showed thermal conductivity values in excess of 45 W/m-K.

In addition, further test vehicles were fabricated by bonding 3 mm×3 mm gold-backed silicon die to 6 mm×6 mm gold backed silicon die. The samples were sinter bonded to each other in a nitrogen atmosphere using a solder reflow profile with a peak temperature of 235° C. for 5 minutes. Upon cooling, the sintered assemblies were sheared at 25° C. using a programmable DAGE 4000 Bondtester die shear tool (Nordson DAGE, Aylesbury, Buckinghamshire, UK). The die shear strengths were observed to be 4.7 kg/mm.

Example 5

Example 5 in Table 6 was prepared as described above in relation to Example 2. The absence of rheological modifiers such as solvents, resins, and thickeners enables comparatively high metal-loaded pastes that can still be manufactured and processed using conventional equipment.

TABLE 6

| Ingredient | Ex. 5 (wt %) |
|---|---|
| Copper Powder | 58.12 |
| SAC 305 Solder Powder | 34.87 |
| Octanoic Acid | 3.48 |
| N,N,N',N'-Tetrakis(2-hydroxypropyl)ethylenediamine | 3.52 |
| N,N,N',N'-Tetrakis(2-hydroxyethyl)ethylenediamine | — |

The thermal conductivity for the paste of Example 5 was measured. The paste of Example 5 was applied to a gold-backed silicon semiconductor die by printing through a stencil to form a 150 micron thick layer of paste on the die when sandwiched between a second gold-backed silicon die. The entire gold-metalized surface of the die was coated. In one test for characterizing thermal conductivity, two 12.7 mm×12.7 mm gold-backed silicon adherents were sinter bonded in a nitrogen environment using a solder reflow profile with a peak temperature of 235° C. for 5 minutes. Upon cooling, the sintered assemblies were tested for thermal diffusivity in a "three-layer" configuration using a Netzsch LFA467. The testing showed an effective thermal conductivity of 33 W/m-K for the paste of Example 5.

In addition, the die shear strength of the paste of Example 5 was measured. The paste of examples 5 was used to prepare test samples fabricated by bonding 1.4 mm×1.4 mm gold-backed die to bare copper substrates. The samples were sinter bonded to each other in a nitrogen atmosphere using a solder reflow profile with a peak temperature of 235° C. for 5 minutes. Upon cooling, the sintered assemblies were sheared at 25° C. using a programmable DAGE 4000 Bondtester die shear tool (Nordson DAGE, Aylesbury, Buckinghamshire, UK). The die shear strength for the paste of Example 5 was observed to be 34 MPa.

Comparative Examples 2 and 3

Comparative Examples 2 and 3 in Tables 7 and 8 were prepared as described above in relation to Example 2. Comparative Example 2 represents a typical TLPS paste, while Comparative Example 3 represents a typical solder material.

TABLE 7

| Ingredient | Comp. 2 (wt %) |
|---|---|
| Copper Powder | 53.40 |
| 80Sn20Bi Solder Powder | 34.95 |
| Ester Oligomer | 2.91 |
| Diallyl Bisphenol A | 1.94 |
| Triethanolamine | 1.94 |
| Hypox RF 1341 | 1.46 |
| Antifoam 1400 | 0.49 |
| Butyl Carbitol | 2.91 |

TABLE 8

| Ingredient | Comp. 3 (wt %) |
|---|---|
| Tin-Based Solder Powder | 85.00 |
| Carbowax 8000 | 4.50 |
| Diethylene glycol monobutyl ether | 4.05 |
| Tetraethylene glycol | 2.55 |
| Triethanolamine | 2.22 |
| Tetraethanolamine hydrochloride | 0.90 |
| Sodium hydroxide in glycerine | 0.69 |
| Flurad FD-430 | 0.02 |
| Triton N-60 | 0.06 |
| Surfynol 104 | 0.02 |

The die shear strength of the material of Comparative Examples 2 and 3 were measured using the procedure described above. The die shear strength of the material of Comparative Example 3 was determined to be 19 MPa, as compared to 34 MPa for Example 5.

The thermal conductivities of Comparative Examples 2 and 3 were also measured using the procedure described above. The testing showed that the material of Comparative Example 2 demonstrated a thermal conductivity of 15 W/m-K, as compared to 33 W/m-K for Example 5.

Figure 1:
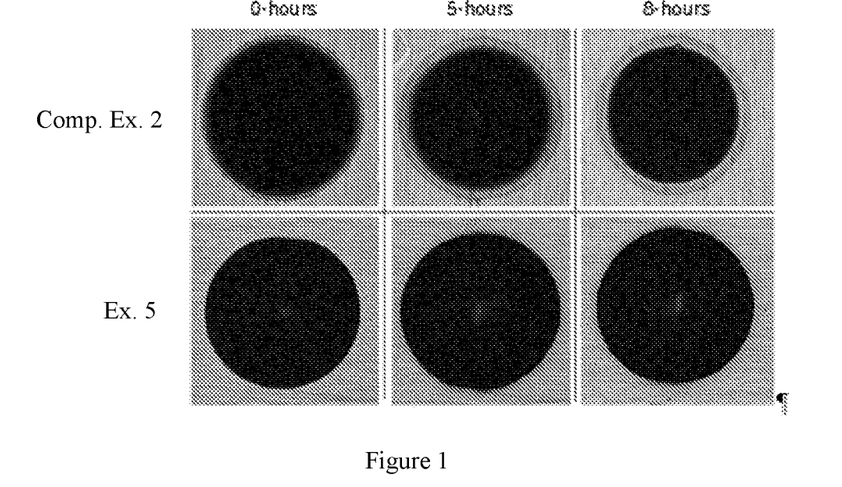
FIG. 1 shows images of test vehicles showing bleed out of Example 5 and Comparative Example 2.
Figure 2:
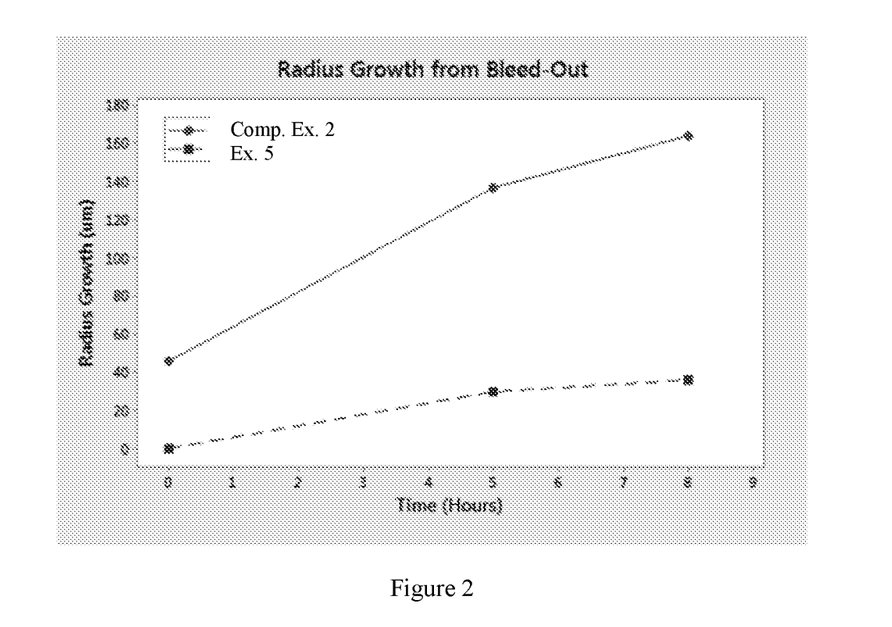
FIG. 2 shows a graph of the radius growth from bleed out as a function of time for the data of FIG. 1.

In addition, further comparative investigations between the pastes of Example 5 and Comparative Example 2 revealed a measurable reduction in the tendency for bleed-out. Test vehicles were prepared by dispensing both pastes through a syringe into dot patterns onto a bare copper substrate, and the radius of the deposits were measured over time under a microscope. The results are shown in Figures 1 and 2.

The data demonstrates that the present mixtures provide a paste consistency with high metal loading that was suitable in consistency for stencil printing in an HVM environment without the need for any additional ingredients. In addition, such materials provide excellent thermal conductivity values. Further, addition of the amine enables materials with excellent TLPS properties with the added benefit of higher shear strength. Although, in some cases, the high shear strength was obtained at the expense of a lower thermal conductivity, the increase in strength could be advantageous in certain applications. Thus, invention compositions, despite the modest number of ingredients, can be manipulated to provide the optimum balance of characteristics for a broad range of applications.

We claim:

1. A particle mixture composition comprising:
a first metallic component comprising a high melting point metal;
a second metallic component comprising a low melting point metal, wherein the low melting point metal is capable of reacting with the high melting point metal to form an intermetallic species at temperature T1;
a fatty acid comprising a compound having the formula:

wherein $R_1$ is selected from the group consisting of unsubstituted or substituted ($C_{2-38}$) alkyls, unsubstituted or substituted ($C_{2-38}$) alkenyls, and unsubstituted or substituted ($C_{2-38}$) alkynyls;
an amine comprising a compound having the formula:

wherein:
X is selected from the group consisting of unsubstituted or substituted ($C_{1-6}$) alkylenes; and
$R_2$, $R_3$, $R_4$ and $R_5$ are each independently selected from the group consisting of hydrogen, hydroxyl, unsubstituted or substituted ($C_{1-6}$) alkyls, unsubstituted or substituted ($C_{1-6}$) alkenyls, and unsubstituted or substituted ($C_{1-6}$) alkynyls;
a triglyceride comprising a compound having the formula:

wherein:
$R_7$, $R_8$, and $R_9$ are each independently selected from the group consisting of monovalent radicals derived from fatty acids, unsubstituted or substituted ($C_{2-38}$) alkyls, unsubstituted or substituted ($C_{2-38}$) alkenyls, unsubstituted or substituted ($C_{2-38}$) alkynyls, unsubstituted or substituted ($C_{2-38}$) carboxyalkyls, unsubstituted or substituted ($C_{2-38}$) carboxyalkenyls, and unsubstituted or substituted ($C_{2-38}$) carboxyalkynyls; and
a cycloaliphatic epoxy resin.

2. The particle mixture composition of claim 1, wherein the fatty acid is liquid at room temperature.

3. The particle mixture composition of claim 1, wherein the second metallic component has a lead-free solder reflow temperature and the fatty acid has a boiling point in excess of the lead-free solder reflow temperature for the second metallic component.

4. The particle mixture composition of claim 1, wherein the fatty acid has a boiling point in excess of 218° C.

5. The particle mixture composition of claim 1, wherein the fatty acid comprises octanoic acid.

6. The particle mixture composition of claim 1, wherein the amine is liquid at room temperature.

7. The particle mixture composition of claim 1, wherein the second metallic component has a lead-free solder reflow temperature and the amine has a boiling point in excess of the lead-free solder reflow temperature for the second metallic component.

8. The particle mixture composition of claim 7, wherein the amine has a boiling point in excess of 218° C.

9. The particle mixture composition of claim 7, wherein the fatty acid and the amine, when mixed, form a liquid at room temperature.

10. The particle mixture composition of claim 1, wherein X is ethylene or propylene.

11. The particle mixture composition of claim 7, wherein the amine comprises n,n,n',n'-tetrakis(2-hydroxyethyl)ethylenediamine.

12. The particle mixture composition of claim 1, wherein $R_7$, $R_8$, and $R_9$ each independently comprise a compound having the formula:

wherein
Y is selected from the group consisting of unsubstituted or substituted $(C_{1-20})$ alkylene and unsubstituted or substituted $(C_{1-20})$ alkenylene; and
∿ represents a point of attachment.

13. The particle mixture composition of claim 1, wherein the triglyceride comprises glyceryl trioctanoate.

14. The particle mixture composition of claim 1, wherein the resin is selected from the group consisting of a thermoplastic resin or a thermoset resin.

15. The particle mixture composition of claim 1, wherein the cycloaliphatic epoxy resin has the formula:

16. The particle mixture composition of claim 1, wherein the first metallic component comprises a mixture of two or more high melting point metals.

17. The particle mixture composition of claim 1, wherein the first metallic component comprises a high melting point metal or mixture of two or more high melting point metals selected from the group consisting of Cu, Ag, Al, Au, Pt, Pd, Be, Rh, Ni, Co, Fe, Mo and combinations thereof.

18. The particle mixture composition of claim 1, wherein the high melting point metal comprises a first metal having a first average distribution of particle sizes and a second metal having a second average distribution of particle sizes.

19. The particle mixture composition of claim 1, wherein the first metallic component is present in an amount of between about 30 mass % and about 70 mass % based on total solid content.

20. The particle mixture composition of claim 1, wherein the second metallic component comprises a mixture of two or more low melting point metals.

21. The particle mixture composition of claim 1 wherein the second metallic component comprises the low melting point metal or a mixture of two or more low melting point metals is selected from the group consisting of Sn, Bi, Zn, Ga, In, Te, Hg, Tl, Sb, Se, Po and combinations thereof.

22. The particle mixture composition of claim 1, wherein the second metallic component comprises a mixture of Sn, Ag and Cu.

23. The particle mixture composition of claim 1, wherein the second metallic component further comprises a carrier metal.

24. The particle mixture composition of claim 23, wherein the carrier metal is selected from the group consisting of Bi, In, Pb, Ag, Cu, Sb, Au, Ni and combinations thereof.

25. The particle mixture composition of claim 1, wherein low melting point metals are present in the second metallic component in an amount of between about 35 mass % and about 65 mass % based on total solid content with the remainder of the second metallic component being the carrier metal.

26. The particle mixture composition of claim 1, wherein the second metallic component is present in an amount of between about 10 mass % and about 60 mass % based on total solid content.

27. A method for preparing the particle mixture of claim 1 comprising the step of combining a predetermined ratio of the first metallic component, the second metallic component and the fatty acid to form a mixture thereof.

* * * * *